(12) United States Patent
Fastow et al.

(10) Patent No.: US 6,700,201 B1
(45) Date of Patent: Mar. 2, 2004

(54) REDUCTION OF SECTOR CONNECTING LINE CAPACITANCE USING STAGGERED METAL LINES

(75) Inventors: Richard Fastow, Cupertino, CA (US); Yue-Song He, San Jose, CA (US); Sameer Haddad, San Jose, CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 72 days.

(21) Appl. No.: 10/013,902

(22) Filed: Dec. 11, 2001

(51) Int. Cl.⁷ .................... H01L 23/48; H01L 23/52; H01L 29/40
(52) U.S. Cl. .................... 257/758; 257/906
(58) Field of Search ................ 257/296, 300, 257/758, 906; 438/250, 238, 339, 386, 393, 399

(56) References Cited

U.S. PATENT DOCUMENTS 6,265,778 B1 * 7/2001 Tottori .................. 257/666
6,406,968 B1 * 6/2002 Chien et al. ............ 438/381

* cited by examiner

*Primary Examiner*—Hoai Pham

(57) ABSTRACT

In a memory array, a plurality of sectors are included. Each sector includes a plurality of parallel bit lines which lie in a plane. Sector connecting lines connect the sectors. These sector connecting lines are parallel to each other and to the bit lines. The sector connecting lines include a first set of sector connecting lines which lie in a plane parallel to and adjacent and spaced from the plane of the bit lines, and a second set of sector connecting lines which lie in a plane parallel to and adjacent and spaced from the plane of the first set of sector connecting lines. When viewed across the sector, consecutive sector connecting lines lie in the two different planes thereof in alternating manner, i.e., the sector connecting lines are in a staggered relation.

9 Claims, 2 Drawing Sheets

REDUCTION OF SECTOR CONNECTING LINE CAPACITANCE USING STAGGERED METAL LINES

BACKGROUND OF THE INVENTION

1. Technical Field

This invention relates generally to memory devices, and more particularly, to the connecting lines of a memory array having a plurality of sectors.

2. Background Art

FIG. 1 shows a general view of a memory device 20 in the form of an array having a plurality of sectors 22A, 22B, 22C. Each sector 22 includes a plurality of bit lines $B_1, B_2, \ldots B_n$ (for example 1024), and a plurality of word lines (for example 512) orthogonal thereto (not shown), A plurality of sector connecting lines $S_1, S_2, S_3, \ldots S_n$ connect the sectors 22A, 22B, 22C (remaining structure left out for clarity in FIG. 1). As shown in FIG. 1 and accompanying FIG. 2, which is a sectional view of FIG. 1, the bit lines $B_1–B_n$, (metal 1) of each sector are parallel to each other and lie in a plane 24. With reference to FIG. 2, the sector 22 includes a semiconductor substrate 26 having a plurality of drain regions 28 formed therein, with adjacent drain regions 28 separated by oxide regions 30. A dielectric layer 32 is disposed thereover, and the bit lines $B_1–B_n$ are formed in the dielectric layer 32 and connected to respective drain regions by vias $V_1, V_2, \ldots V_n$. Provided over this structure is another dielectric layer 34, on which are provided the plurality of sector connecting lines $S_1, S_2, \ldots S_n$ (metal 2). These sector connecting lines $S_1–S_n$ are parallel to the bit lines $B_1–B_n$, and lie in another plane 36 spaced from and parallel to the plane 24 of the bit lines $B_1–B_n$. Transistor switches $T_1, T_2, \ldots T_n$, connect each sector connecting line with either one of a pair of adjacent bit lines therebelow, all as is well-known.

The sector connecting lines, connecting many sectors of the array, are quite long. With device dimensions continuously decreasing, these sector connecting lines are brought closer and closer together, resulting in increased capacitance between the adjacent sector connecting lines. This high capacitance can affect the performance of the array, by slowing down operation and increasing the current demand thereof.

Therefore, what is needed is an improved layout of array which results in decreased capacitance between adjacent sector connecting lines.

DISCLOSURE OF THE INVENTION

In the present memory device, a plurality of sectors are included, each in turn including a plurality of parallel bit lines (metal 1) which lie in a plane. Sector connecting lines, parallel to each other and to the bit lines, connect the sectors. The sector connecting lines include a first set of sector connecting lines (metal 2) which lie in a plane parallel to and adjacent and spaced from the plane of the bit lines, and a second set of sector connecting lines (metal 3) which lie in a plane parallel to and adjacent and spaced from the plane of the first set of sector connecting lines. When viewed across a sector, consecutive sector connecting lines lie in the two different planes thereof in alternating manner, i.e., in staggered relation. This staggered relation increases the distance between adjacent sector lines, so as to decrease capacitance therebetween.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE FOR CARRYING OUT THE INVENTION

Reference is now made in detail to a specific embodiment of the present invention which illustrates the best mode presently contemplated by the inventors for practicing the invention.

Figure 3:
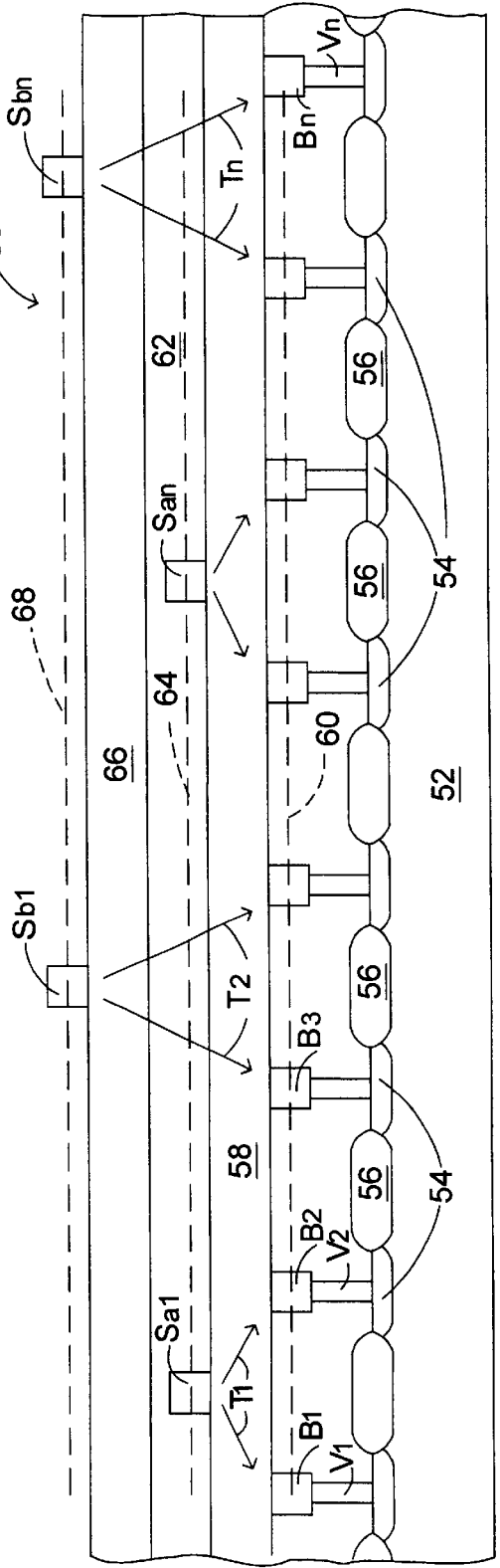
FIG. 3 is a sectional view similar to that shown in FIG. 2, but illustrating the present invention.

FIG. 3 is a sectional view illustrating the present invention.

Figure 1:
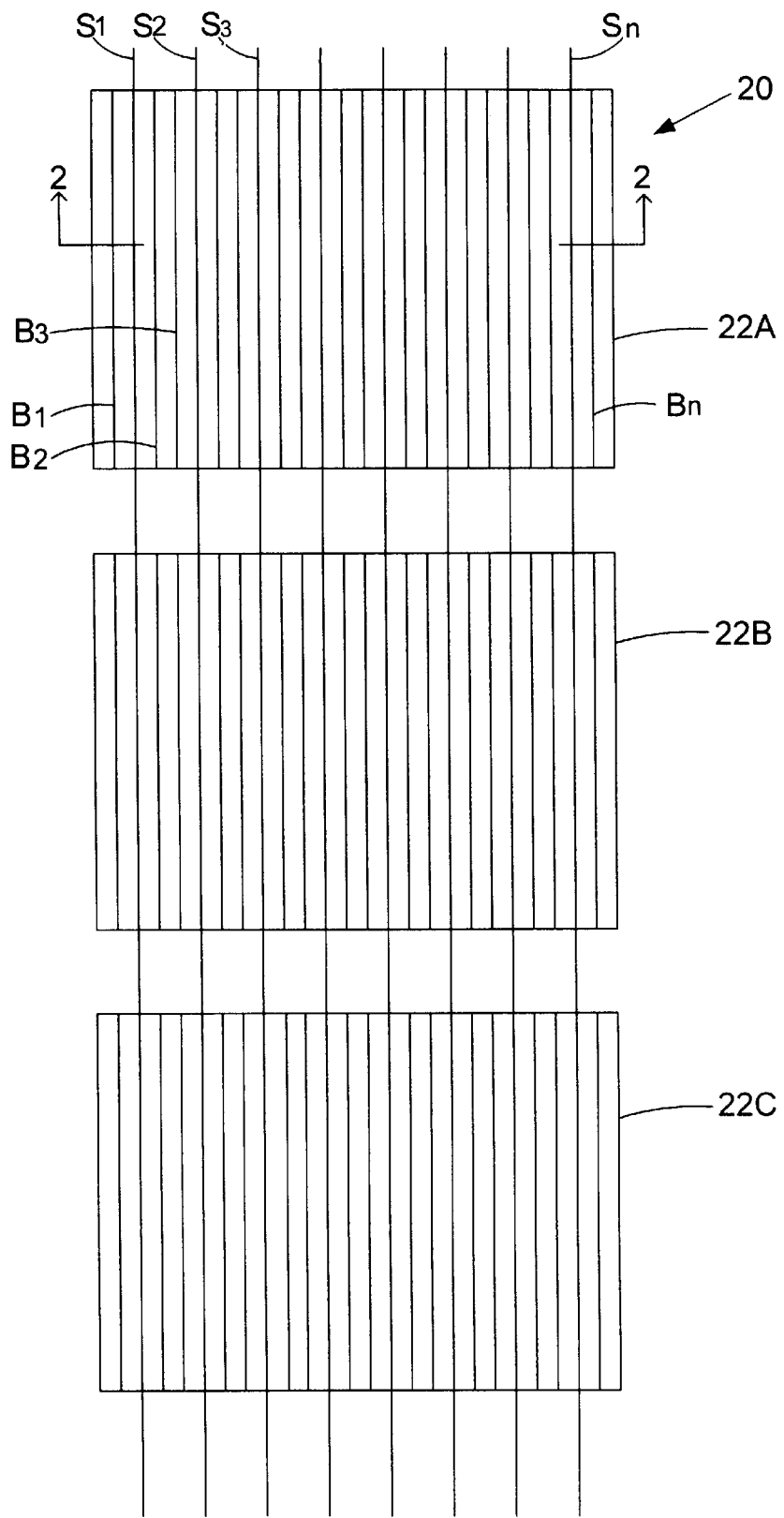
FIG. 1 is a plan view of a memory array of the prior art.
Figure 2:
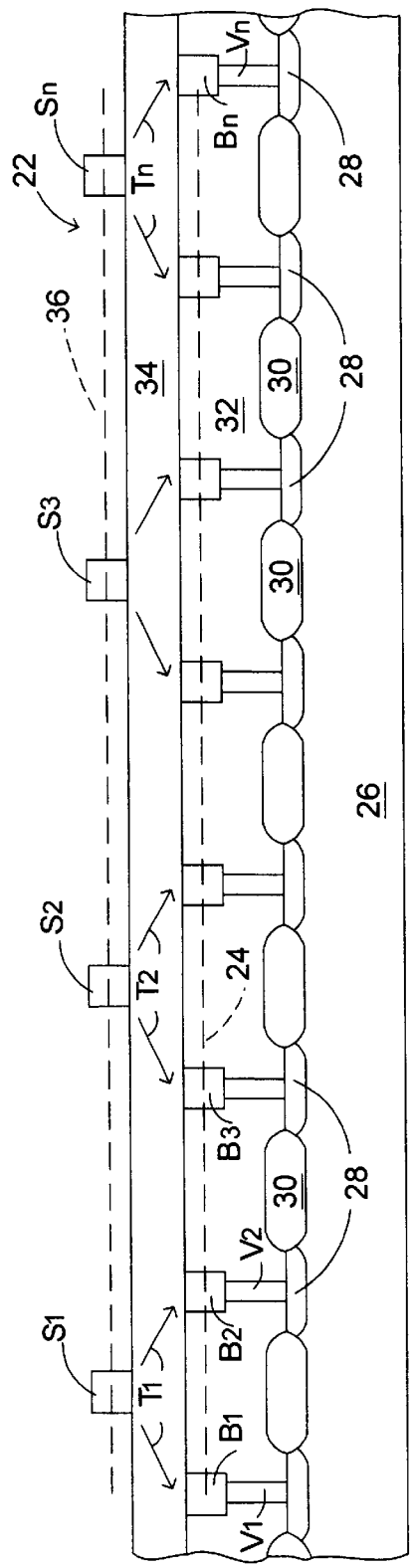
FIG. 2 is a section al view taking along the line 2—2 of FIG. 1.

Similar to FIG. 2, the sector 50 includes a semiconductor substrate 52 having a plurality of drain regions 54 formed therein, with adjacent drain regions 54 separated by oxide regions 56. A dielectric layer 58 is disposed thereover, and bit lines $B_1, B_2, \ldots B_n$ (metal 1) are formed in the dielectric layer 58 and connected to respective drain regions by vias $V_1, V_2, \ldots V_n$. The bit lines $B_1–B_n$, are parallel to each other and lie in a plane 60.

Another dielectric layer 62 is provided over this structure. A plurality of sector connecting lines $S_{a1} \ldots S_{an}$ (metal 2) are provided on this dielectric layer 62. These sector connecting lines $S_{a1}–S_{an}$ (metal 2) are parallel to the bit lines $B_1–B_n$ (metal 1) and lie in a plane 64 above, spaced from and parallel to the bit line plane 60.

Another dielectric layer 66 is provided over this structure, and another plurality of sector connecting lines $S_{b1}, \ldots S_{bn}$ (metal 3) are provided on this dielectric layer 66. The sector connecting lines $S_{b1}–S_{bn}$ (metal 3) are again parallel to the bit lines $B_1–B_n$ (metal 1), and are parallel to the sector connecting lines $S_{a1}–S_{an}$ (metal 2), and lie in a plane above 68 spaced from and parallel to the plane 64 of the sector connecting lines $S_1–S_{an}$ (metal 2) and the plane 60 of the bit lines $B_1–B_n$.

It will be seen that the entire group of sector connecting lines is made up of the first set $S_a$ of sector connecting lines $S_{a1}–S_{an}$ and a second set $S_b$ of sector connecting lines $S_{b1}–S_{bn}$, with one set $S_a$ of sector connecting lines lying in a plane 64 different from the plane 68 of the other set $S_b$ of sector connecting lines, i.e., the sector connecting lines $S_{a1}–S_{an}$ of the set $S_a$ have a non-planar relationship with the sector connecting lines $S_1–S_{bn}$ of the set $S_b$. It will also be seen that consecutive sector connecting lines $S_{a1}, S_{b1}$, etc. of the entire group disposed across a sector 50 lie in the plane 64 and the plane 68 in an alternating manner, so that the sector connecting lines are in a staggered relationship across the sector 50. Each sector connecting line $S_{a1}, S_{b1}, \ldots S_{an}, S_{bn}$ is in operative association with a pair of adjacent bit lines therebelow by means of respective transistor switches $T_1, T_2, \ldots T_n$, so that each such sector connecting line can be connected to either one of the pair of associated bit lines therebelow, as similarly described above.

As will be seen, the distance between adjacent sector connecting lines is greater than that distance as described above with regard to the prior art. Thus, the capacitance between the adjacent sector connecting lines is reduced as compared to the prior art. This low capacitance increases operating speed of the array, and lowers the current demand of the array, as compared to the prior art structure. Thus, an array that is more efficient in operation is provided in accordance with this invention.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
   a plurality of sectors each including a plurality of bit lines;
   a plurality of sector connecting lines, each sector connecting line associated with bit lines of the sectors;
   some of the sector connecting lines having a non-planar relation with others of the sector connecting lines.

2. The device of claim 1 wherein some of the sector connecting lines lie in a first plane, and others of the sector connecting lines lie in a second plane different from the first plane.

3. The device of claim 2 wherein the first and second planes are parallel.

4. The device of claim 3 wherein the sector connecting lines lying in the first plane are parallel to each other, and the sector connecting lines lying in the second plane are parallel to each other.

5. The device of claim 4 wherein the bit lines of each sector are parallel to each other, and the sector connecting lines associated therewith are parallel to the bit lines.

6. The device of claim 4 wherein consecutive sector connecting lines disposed across a sector lie alternately in the first and second planes.

7. The device of claim 4 wherein the bit lines of a sector lie in a third plane, the first and second planes of the sector connecting lines associated therewith being parallel to the third plane.

8. A memory device comprising:
   a plurality of sectors each including a plurality of parallel bit lines;
   a plurality of sector connecting lines parallel to the bit lines, each sector connecting line associated with bit lines of the sectors;
   the plurality of sector connecting lines comprising a first set of the sector connecting lines lying in a first plane, and a second set of the sector connecting lines lying in a second plane spaced from and parallel to the first plane;
   the plurality of bit lines lying in a third plane spaced from and parallel to the first and second planes.

9. The device of claim 8 wherein consecutive sector connecting lines disposed across a sector lie alternately in the first and second planes.

* * * * *